United States Patent [19]
McAllister

[11] Patent Number: 5,349,325
[45] Date of Patent: Sep. 20, 1994

[54] MULTI-LAYER LOW MODULATION POLYCRYSTALLINE SEMICONDUCTOR RESISTOR

[75] Inventor: Kenneth McAllister, Hollister, Calif.

[73] Assignee: Integrated Device Technology, Inc., Santa Clara, Calif.

[21] Appl. No.: 63,586

[22] Filed: May 18, 1993

[51] Int. Cl.$^5$ ............................................. H01C 1/012
[52] U.S. Cl. ..................................... 338/307; 338/308; 338/314; 257/536
[58] Field of Search ............... 338/306, 307, 308, 309; 257/536

[56] References Cited

U.S. PATENT DOCUMENTS

| | | | |
|---|---|---|---|
| 4,001,762 | 1/1977 | Aoki et al. | 338/309 |
| 4,498,007 | 2/1985 | Schwarzmann | 250/390.03 |
| 5,037,766 | 8/1991 | Wang | 437/24 |
| 5,041,893 | 8/1991 | Nagai et al. | 257/379 |
| 5,045,870 | 9/1991 | Lamey et al. | 338/308 X |
| 5,168,076 | 12/1992 | Godinho et al. | 437/60 |
| 5,172,211 | 12/1992 | Godinho et al. | 257/536 |
| 5,200,733 | 4/1993 | Davis et al. | 338/307 X |

OTHER PUBLICATIONS

Mahan, "Gigaohm–Range Polycrystalline Silicon...," IEEE Transactions on Electron Devices, Jan., 1983, vol. Ed. 30, pp. 45–51.

Ohzone, "Ion-Implanted Thin Polycrystalline–Silicon High–Value Resistors...," IEEE Transactions on Electron Devices, Sep., 1985, vol. Ed. 32, pp. 1749–1756.

Wolf, *Silicon Processing for the VLSI Era*, Copyright 1990, Lattice Press, vol. 2, pp. 581, 578, and 575–576.

Wolf et al, *Silicon Processing for the VLSI Era*, Copyright 1986, Lattice Press, vol. 1, pp. 175–177.

*Primary Examiner*—Marvin M. Lateef
*Attorney, Agent, or Firm*—Skjerven, Morrill, MacPherson, Franklin and Friel

[57] ABSTRACT

The material to be used in a semiconductor resistor is produced by successively depositing multiple layers of substantially intrinsic polycrystalline semiconductor material. The deposition process is stopped between layers to create an interruption of the polycrystalline structure of the semiconductor material. This interruption reduces the modulation experienced by the resistor when it is located above an underlying conductor in a semiconductor circuit. Such a configuration typically exists in a memory cell where the load resistor of a field-effect transistor is located over the gate of the transistor.

18 Claims, 5 Drawing Sheets

MULTI-LAYER LOW MODULATION POLYCRYSTALLINE SEMICONDUCTOR RESISTOR

FIELD OF THE INVENTION

This invention relates to the deposition of multiple layers of substantially intrinsic polycrystalline semiconductor material to create a resistor for use in a semiconductor device.

DESCRIPTION OF THE PRIOR ART

Substantially intrinsic polysilicon resistors are known in the art and have been used as high-value load resistors in memory cells since the late 1970's. Polysilicon which is "substantially intrinsic" is capable of producing resistors with resistances on the order of one hundred giga ohms ($100 \times 10^9$).

Such resistors have been fabricated using the following process. First, a layer of substantially intrinsic polycrystalline silicon (polysilicon) is deposited onto an insulated surface of a semiconductor device. A mask is then placed over the area of substantially intrinsic polysilicon which is to form the resistor. The uncovered polysilicon surface is then heavily doped to create an area of conductive polysilicon having a resistivity which is much less than the covered, substantially intrinsic polysilicon. Unnecessary portions of this conductive polysilicon are then removed through an etching process. The remaining conductive polysilicon provides electrical connection from the substantially intrinsic polysilicon resistor to other parts of the circuit. (Wolf, Silicon Processing for the VLSI Era, Vol. 2, p. 581, Lattice Press, Copyright 1990).

As shown in FIG. 1, substantially intrinsic polysilicon material 1 has a polycrystalline structure comprised of single grain regions 2 separated by grain boundaries 3. The resistance of such a structure is dependent on the grain boundaries 3 and the number of charge carriers present. Each of the grain boundaries 3 possess energy barriers which must be overcome in order for a charge carrier to pass from one single grain region 2 to another. These energy barriers may be overcome when an appropriate external voltage source 4 is applied to each end of the polysilicon material 1. (Wolf and Tauber, Silicon Processing for the VLSI Era, Vol. 1, pp. 175–77, Lattice Press, Copyright 1986).

The following parameters also effect the resistivity of polysilicon material. Large grain sizes will increase the mobility of the charge carriers and thereby reduce the resistivity of the polycrystalline structure. Small grain sizes decrease the mobility of the charge carriers and result in large grain boundaries. These large grain boundaries exhibit defects and dangling bonds which result in the formation of trapping states that are capable of trapping and immobilizing the charge carriers. This reduces the number of free carriers available for conduction. Further, these trapped charge carriers become electrically charged and create potential energy barriers that impede the motion of carriers from one grain to another.

To illustrate how the resistance of a substantially intrinsic polycrystalline silicon resistor can be modulated, FIG. 2 shows a semiconductor substrate 5, a first insulating layer 7, a first-level conductor 9, a second insulating layer 11, a substantially intrinsic polysilicon resistor 13, and heavily doped polysilicon connectors 15. When a voltage is applied to first-level conductor 9, an electric field is produced. This electric field influences the energy barriers between the grains present in substantially intrinsic polysilicon resistor 13. A positive voltage applied to first-level conductor 9 will reduce these energy barriers and thereby decrease the resistance of polysilicon resistor 13. Conversely, a negative voltage applied to first-level conductor 9 will increase the energy barriers between the grains present in the substantially intrinsic polysilicon and thereby increase the resistance of polysilicon resistor 13. The change in resistance caused by this field effect will be referred to as modulation. Modulation can occur even if the first-level conductor 9 is not located directly under polysilicon resistor 13.

An example of a device in which polysilicon resistors are located over or adjacent to underlying conductors occurs in a four-transistor static random-access memory (SRAM) memory cell. The circuit diagram of such a memory cell is shown in FIG. 3. A portion of a cross section of such a cell is illustrated in FIG. 4, which shows the substrate 17, drain 19, source 21, first insulating layer 22, gate 23, second insulating layer 24, polysilicon load resistor 25, and polysilicon connectors 27 associated with a transistor of the memory cell. Polysilicon load resistor 25 is located above gate 23 of the transistor. (Wolf, Silicon Processing for the VLSI Era, Vol. 2, p. 578, Lattice Press, Copyright 1990). The voltage applied to gate 23 during the normal operation of the memory cell subjects polysilicon load resistor 25 to modulation.

In such a memory chip, modulation of the load resistor is undesirable. A decrease in the load resistance can cause the memory chip to consume excessive power from the voltage supply, thereby causing the chip to fail to meet a low power specification. An increase in the load resistance is also undesirable since this will cause an increased voltage drop across the load resistor. This will result in a decrease in the drain-to-source voltage ($V_{DS}$) of the transistor to which the load resistor is connected. If $V_{DS}$ drops too low, the memory chip will not operate properly.

Prior art four-transistor SRAM memory cells have not solved this problem of load resistance modulation. A six-transistor SRAM memory cell, which replaces the load resistors with transistors, mitigates the modulation problem. However, this six-transistor memory cell uses more chip area than the four-transistor SRAM memory cell. An improvement to the standard six-transistor memory cell "stacks" the transistors on top of each other. The transistor layers may be separated by a layer of recrystallized silicon or may be fabricated with a hydrogen passivated polysilicon transistor. This allows more memory cells to be fabricated within a unit area. However, the processing steps required to fabricate these thin film transistors are more complicated and difficult to control than those required to produce the load resistors in the four transistor SRAM memory cell. (Wolf, Silicon Processing for the VLSI Era, Vol. 2, pp. 575–76, Lattice Press, Copyright 1990).

It would therefore be highly desirable to have a substantially intrinsic polysilicon resistor which is resistant to modulation from underlying conductors. It would also be desirable to have a simple and inexpensive method for creating such a resistor.

SUMMARY OF THE INVENTION

The present invention provides a modulation-resistant semiconductor resistor. In accordance with the present invention, a resistor is made of at least two layers of substantially intrinsic polycrystalline semiconductor material. An interruption in the polycrystalline structure exists along at least one boundary between the layers.

Also in accordance with the present invention, a predetermined thickness of substantially intrinsic semiconductor material is deposited on an insulated surface to create a first layer having a polycrystalline structure. After the first layer has been deposited, the polycrystalline structure is interrupted by temporarily discontinuing the deposition process. After a period of time, the deposition process is continued until an additional layer of polycrystalline semiconductor material has been deposited over the first layer. This process may be reiterated, alternating polycrystalline layers and interruptions, until a desired number of polysilicon layers have been formed.

DETAILED DESCRIPTION OF THE INVENTION

First Embodiment

Figure 1:
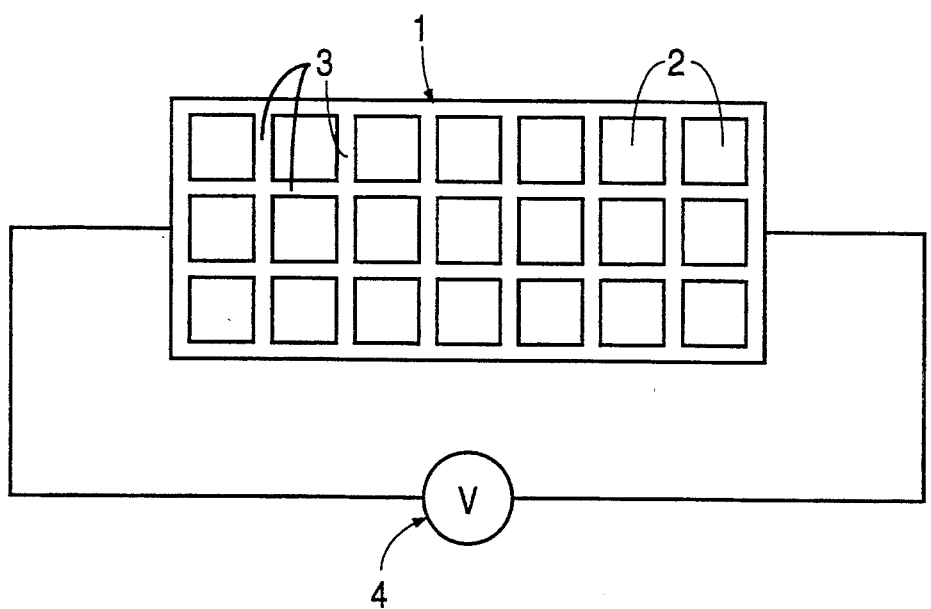
FIG. 1 is a diagram showing the structure of polycrystalline silicon.
Figure 2:
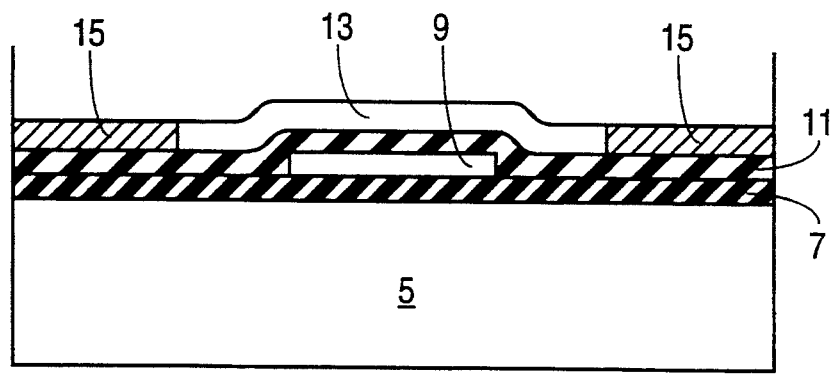
FIG. 2 is a cross section of a prior art semiconductor circuit having a polysilicon resistor and a first-level conductor.
Figure 3:
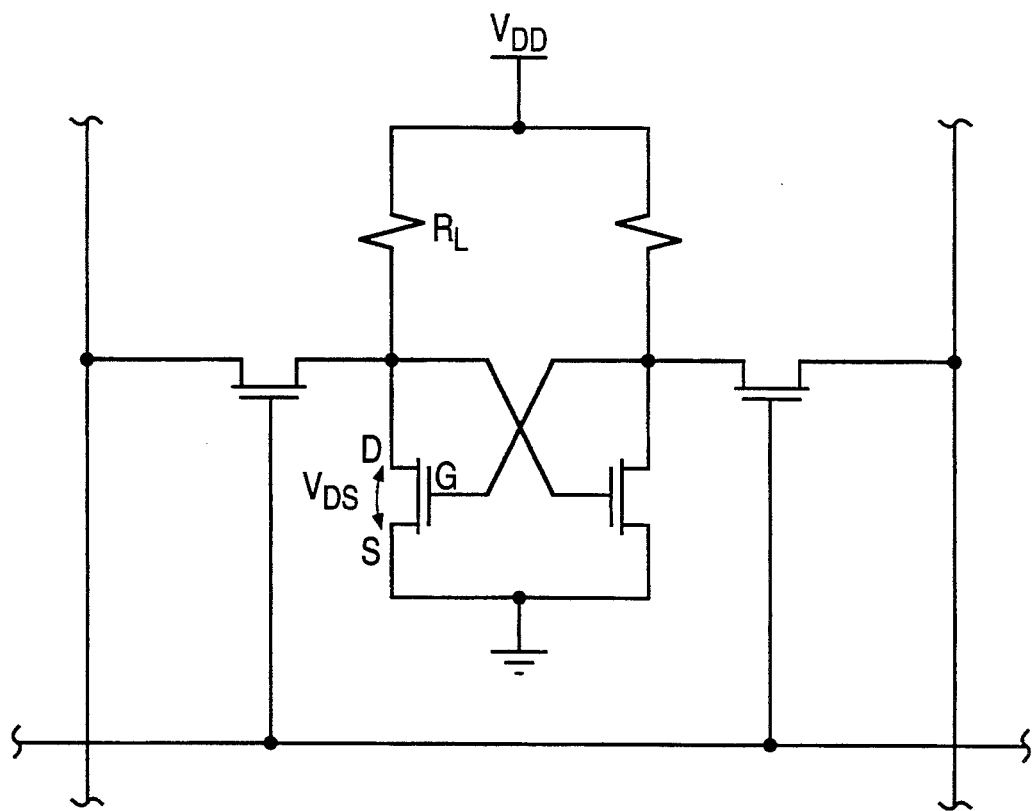
FIG. 3 is a circuit diagram of a conventional four-transistor SRAM memory cell.
Figure 4:
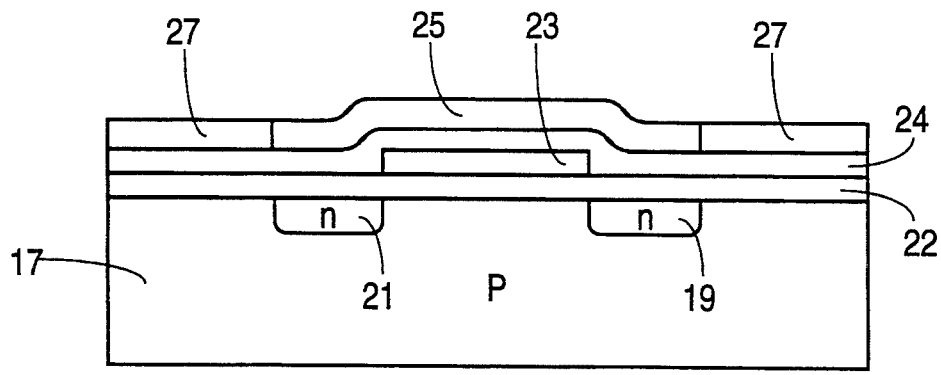
FIG. 4 is a cross section of a portion of a conventional four-transistor SRAM memory cell.
Figure 5:
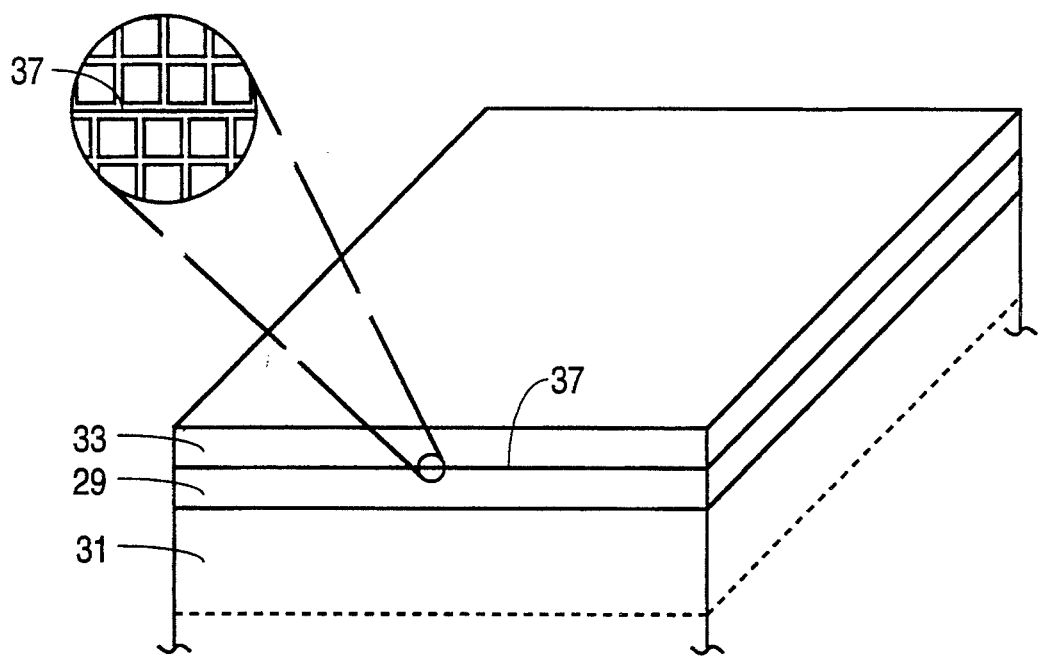
FIG. 5 is a perspective view of semiconductor material used to make a resistor in a first embodiment of the invention.

One embodiment of the present invention may be more easily understood with reference to FIG. 5, which illustrates the fabrication of a substantially intrinsic polycrystalline semiconductor material to be used in a high-value load resistor. The total thickness of this resistor for this application is typically 500–2500Å. Thicknesses less than 500Å result in high value load resistors which do not provide adequate current to the connected transistor. Thicknesses greater than 2500Å result in low value load resistors which require excessive current.

FIG. 5 shows a perspective view of the deposition of a first layer of substantially intrinsic polysilicon 29 on an insulating layer 31 of a semiconductor device. This first layer of polysilicon 29 can be deposited using a conventional low pressure chemical vapor deposition (LPCVD) process well known in the art. During this process, a reactant gas such as silane ($SiH_4$) is introduced into a vacuum tube. The silane contacts the surface of a semiconductor material and forms polysilicon and hydrogen gas. This process typically occurs in the temperature range 580°–680° C.

Once the first layer of polysilicon 29 is deposited, the silane flow is turned off. The vacuum system removes all of this reactant gas. The first layer of polysilicon 29 is then allowed to sit in the vacuum tube for a predetermined amount of time. While any amount of sitting time produces a reduction in resistance modulation, a sitting time of under 60 minutes is preferable.

The polysilicon deposition process is then continued by re-introducing the reactant gas into the vacuum tube. This produces a second layer of substantially intrinsic polysilicon 33. Although any ratio between the thicknesses of the first and second layers reduces the modulation of resistance, in an application as a high-value load resistor, it is preferable for the first layer to be thinner than the second layer. While this embodiment describes only two layers, the previously described process can be repeated to form additional layers.

The operation and advantages of the structure which results from the previously described process will now be described. The interface between each successively deposited polysilicon layer contains an interruption 37 in the polycrystalline structure of the deposited polysilicon. This interruption 37, which is represented in the magnified portion of FIG. 5, is caused by the discontinuation/sitting period/continuation steps previously described. The interruption 37 creates an offset or discontinuity in the grain boundaries or energy barriers in the vertical direction.

This offset will partially shield an electric field applied in a vertical direction across the interruption 37. To illustrate how this reduces modulation, assume an electric field is applied to the structure shown in FIG. 5, such that the source of the electric field is located below first layer 29. This electric field will influence the energy barriers of the polysilicon structure in both first layer 29 and second layer 33. However, the partial shielding created by interruption 37 causes the field effect to be much weaker in second layer 33. Since a substantial portion of the structure experiences a reduced field effect, the overall modulation of the structure is reduced.

When the resistor disclosed in the first embodiment is used in a four-transistor SRAM memory cell, the resulting SRAM memory has the ability to meet low power specifications. Since the resistance of the resistor disclosed in the first embodiment is not reduced by modulation to the same degree as a single-layer resistor, lower currents flow in the resistor of the first embodiment for the same applied voltage. These lower currents result in reduced power consumption.

Second Embodiment

Figure 6:
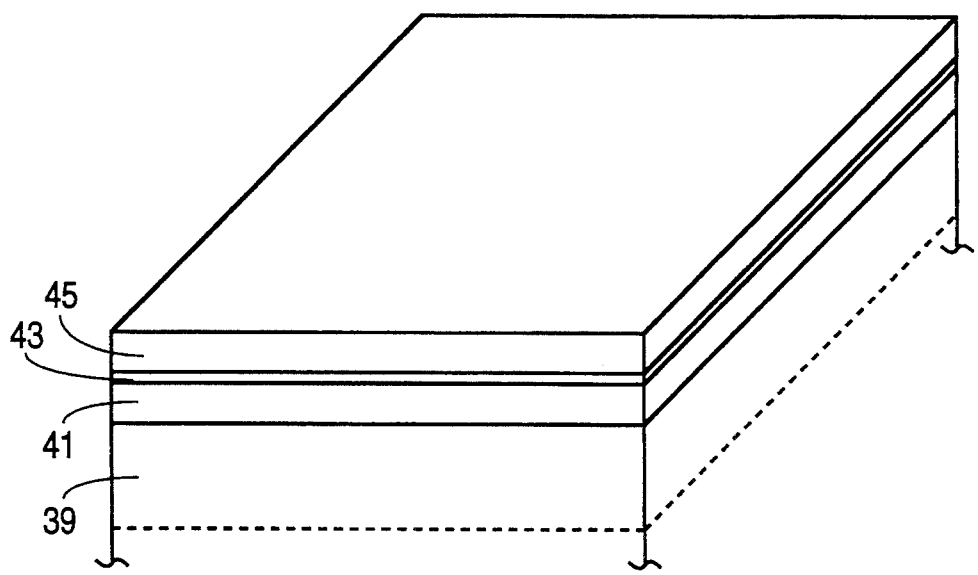
FIG. 6 is a perspective view of semiconductor material used to make a resistor in a second embodiment of the invention.
Figure 7:
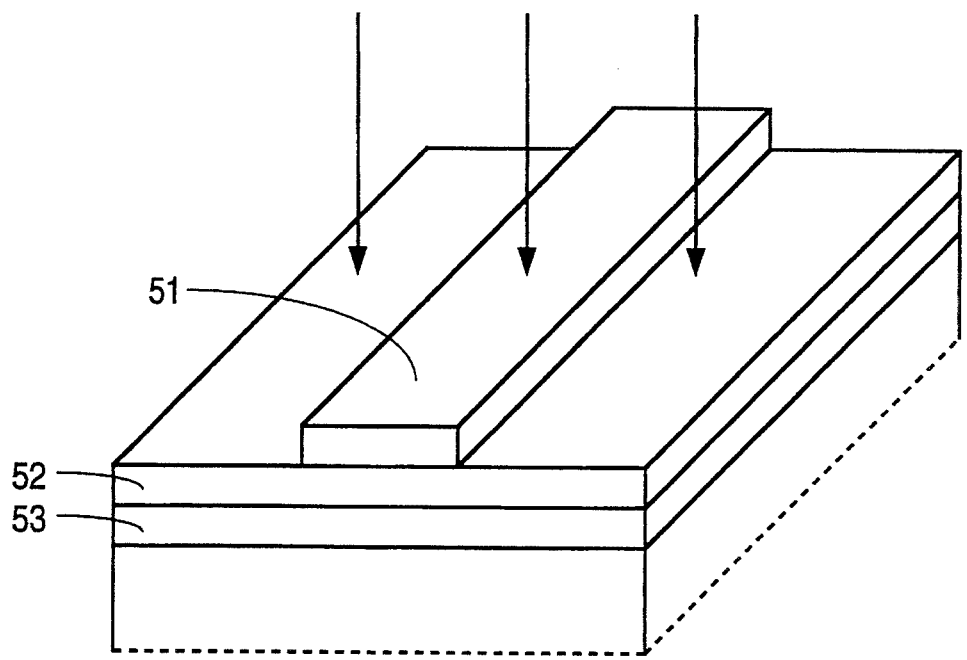
FIGS. 7, 8, 9 and 10 are perspective views illustrating steps in fabricating a semiconductor resistor.

Another embodiment of the present invention may be understood with reference to FIG. 6, which illustrates the fabrication of another substantially intrinsic polycrystalline semiconductor material to be used in a resistor.

FIG. 6 shows a perspective view of the deposition of a first layer of substantially intrinsic polysilicon 41 on an insulating layer 39 of a semiconductor device. This first layer of polysilicon 41 is deposited using the same process and parameters described in the first embodiment.

Once the first layer of polysilicon 41 is deposited, the semiconductor device is removed from the vacuum tube to allow a thin oxide to grow for a predetermined amount of time. While any amount of removal time produces a reduction of resistance modulation, a removal time of less than 4 hours is preferable. Removing the semiconductor device from the vacuum tube allows a thin insulating layer 43 of silicon dioxide to form on the upper surface of the first layer of polysilicon 41. This thin insulating layer preferably has a thickness of less than 10Å. This thin layer could also be grown "in-situ" or in-process by introducing an oxidizing specie to the vacuum tube.

The semiconductor device is then re-loaded into the vacuum tube or the oxidizing ambient is discontinued, and the polysilicon deposition process is continued by reintroducing the reactant gas to the tube. This produces a second layer of substantially intrinsic polysilicon 45. Although any ratio between the thicknesses of the first and second layers reduces the modulation of resistance, in an application as a high-value load resistor, it is preferable for the first layer to be thinner than the second layer. While this embodiment describes only two layers, the previously described process can be repeated to form additional layers.

The resistor structure resulting from the second embodiment operates in a similar manner to the structure described in the first embodiment. That is, the thin insulating layer 43 creates an interruption in the polycrystalline structure. As previously described in connection with the first embodiment, this interruption similarly provides a partial shield to an electric field applied to the resistor structure. This results in reduced modulation of the second layer 45.

Like the resistor disclosed in the first embodiment, the resistor disclosed in the second embodiment may be used in a four-transistor SRAM memory cell to create a SRAM memory with the ability to meet low power specifications. Since the resistance of the resistor disclosed in the second embodiment is not reduced by modulation to the same degree as a single-layer resistor, lower currents flow in the resistor of the second embodiment for the same applied voltage. These lower currents result in reduced power consumption.

After the desired number of substantially intrinsic layers of polysilicon have been deposited in either the first or second embodiment, the fabrication of the resistor may be completed using techniques known in the art. FIGS. 7–10 illustrate such a technique. First, a pattern of polysilicon 54 is formed from polysilicon layers 52 and 53 using a process known in the art. One such process includes covering the desired pattern with a mask 51, etching the polysilicon around the mask 51, and removing the mask 51. These steps result in the structure shown in FIG. 8.

Figure 8:
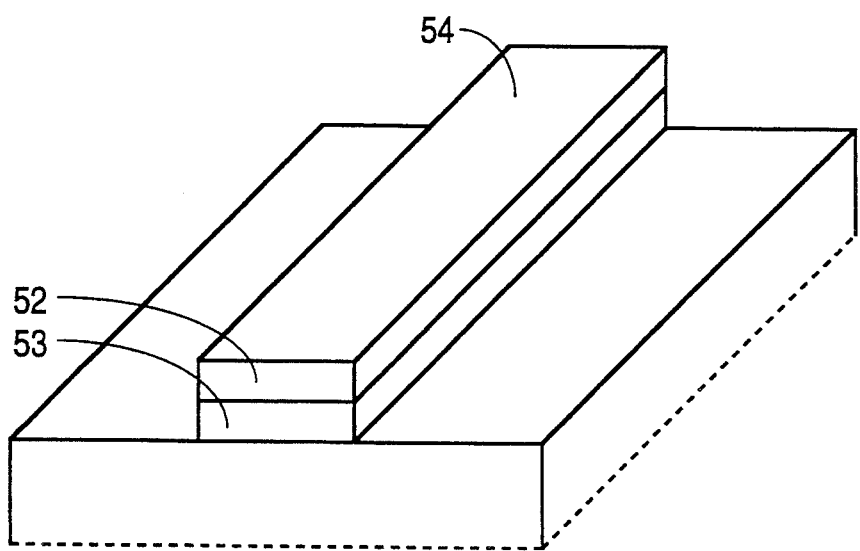
Figure 9:
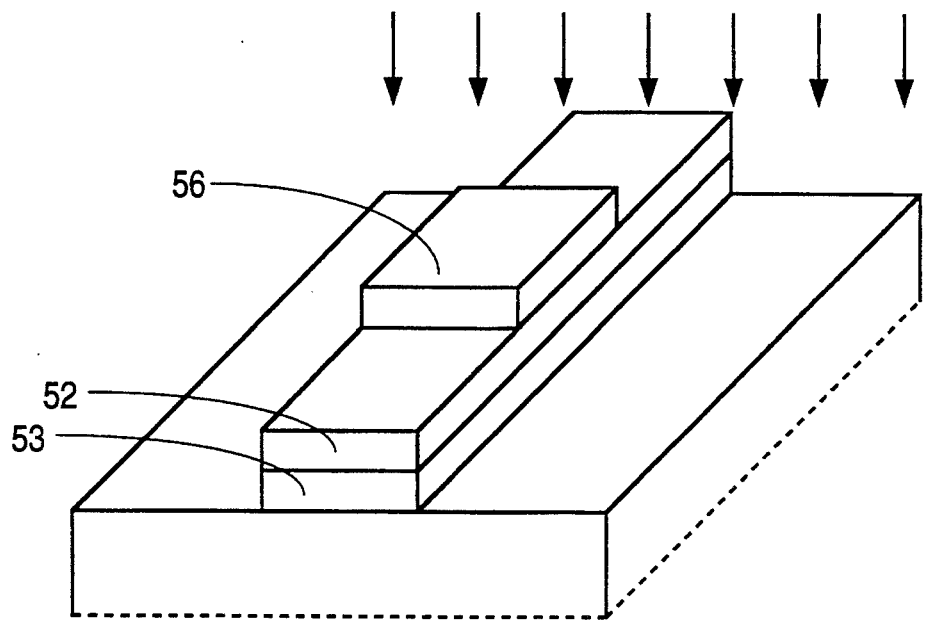
Figure 10:
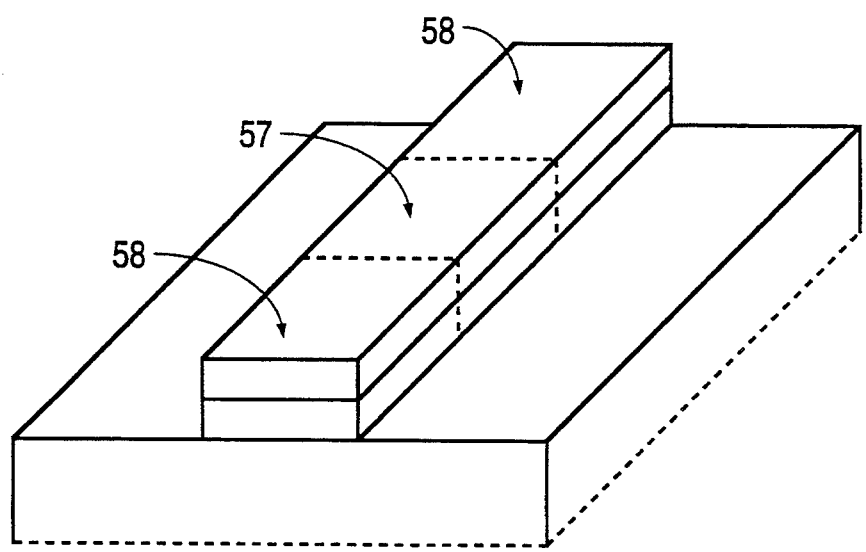

Next, a layer of photoresist is formed over the surface of the structure shown in FIG. 8. A mask defining the area of the desired resistor 57 is placed over the layer of photoresist. The photoresist is exposed and developed to leave mask 56 as shown in FIG. 9. The region of polysilicon not covered by the mask 56 is heavily doped using a process known in the art. The mask size should take into account the effect of lateral diffusion of impurities from the highly doped regions during the activation anneal of the polysilicon following ion implantation. Mask 56 is then removed, leaving the desired resistor 57 and conductive elements 58, which connect the resistor 57 to other elements of the circuit. This resulting structure is shown in FIG. 10.

Comparison with the Prior Art

Tables 1 and 2 show a comparison of resistors created using the first embodiment of the present invention to a prior art resistor. The prior art resistor was created by using a LPCVD process to deposit a single layer of substantially intrinsic polysilicon having a thickness of 2000Å at a temperature of 630° C.

The resistors formed in accordance with the first embodiment of the present invention have various layer thicknesses, wherein each resistor has an overall thickness of 2000Å. Each resistor was fabricated by depositing a first layer of substantially intrinsic polysilicon at 600° C., allowing the first layer a sitting time of 40 minutes, and depositing a second layer of substantially intrinsic polysilicon at 600° C.

TABLE 1

| | Single Layer of Metallization | | | |
|---|---|---|---|---|
| | Prior Art | 1st Embodiment | 1st Embodiment | 1st Embodiment |
| 1st Layer Å | 2000 | 500 | 1000 | 1500 |
| 2nd Layer Å | — | 1500 | 1000 | 500 |
| Deposition Temp. °C. | 630 | 600 | 600 | 600 |
| Sitting Removal Time | — | 40 | 40 | 40 |
| $R_0$ (Giga-ohms) $V_R = .5$ $V_G = .5$ | 370 | 384 | 398 | 391 |
| $R_1$ (Giga-ohms) $V_R = 5$ $V_G = .5$ | 132 | 237 | 265 | 240 |
| $R_2$ (Giga-ohms) $V_R = 5$ $V_G = 5$ | 66 | 221 | 242 | 215 |
| $R_3$ (Giga-ohms) $V_R = 5$ $V_G = -5$ | 482 | 384 | 420 | 415 |
| $R_3/R_2$ | 7.3 | 1.74 | 1.74 | 1.93 |
| $R_3/R_0$ | 1.3 | 1.0 | 1.06 | 1.06 |
| $R_2/R_0$ | .18 | .58 | .61 | .55 |
| % of Chips Failing Low Power Testing | 97% | 13% | — | — |

Tests not run

TABLE 2

| | Two Layers of Metallization | | | |
|---|---|---|---|---|
| | Prior Art | 1st Embodiment | 1st Embodiment | 1st Embodiment |
| 1st Layer Å | 2000 | 500 | 1000 | 1500 |
| 2nd Layer Å | — | 1500 | 1000 | 500 |
| Deposition Temp. °C. | 630 | 600 | 600 | 600 |
| Sitting Removal Time | — | 40 | 40 | 40 |
| $R_0$ (Giga-ohms) $V_R = .5$ $V_G = .5$ | 116 | 274 | 268 | 285 |
| $R_1$ (Giga-ohms) $V_R = 5$ $V_G = .5$ | 66 | 170 | 198 | 181 |
| $R_2$ (Giga-ohms) $V_R = 5$ $V_G = 5$ | 9 | 124 | 128 | 126 |
| $R_3$ (Giga-ohms) $V_R = 5$ $V_G = -5$ | 306 | 293 | 297 | 312 |
| $R_3/R_2$ | 34.0 | 2.36 | 2.32 | 2.48 |
| $R_3/R_0$ | 2.6 | 1.07 | 1.11 | 1.09 |
| $R_2/R_0$ | .08 | .45 | .48 | .44 |
| % of Chips Failing Low Power Testing | 97% | 13% | — | — |

Tests not run

Tables 1 and 2 illustrate the improved modulation characteristics of resistors produced in accordance with the present invention. Table 1 presents measurements taken after a single layer of metallization is formed over the resistor. Table 2 presents measurements taken after two layers of metallization are formed over the resistor. The differences in the measurements taken after depositing the first and second levels of metallization occur as a result of the passivation layer placed between the first and second metal levels. This passivation layer introduces hydrogen which travels downward and penetrates the grain boundaries of the polycrystalline silicon structure which makes up the load resistor. This hydrogen reduces the energy barriers present in the grain boundaries and thereby reduces the resistance of the resistor.

While the invention has been described with reference to particular embodiments, this description is solely for the purpose of illustration and is not to be construed as limiting the scope of the invention. For example, semiconductor materials other than silicon may be used. Substantially intrinsic germanium and gallium arsenide also possess a polycrystalline structure which could be used to create resistors as described in the specification.

Additionally, while one specific method for producing a 10Å layer of silicon dioxide was described, other methods of producing this layer could be used.

Also, as noted above, more than two layers of substantially intrinsic polycrystalline semiconductor material may be used in forming a resistor in accordance with the present invention. The use of multiple layers of polysilicon minimizes the modulation of load resistors and results in more consistent values of current through the load resistor. This allows for low power, battery operated applications.

Finally, a different ratio may be used for the thicknesses of the layers described in the first and second embodiments. Variation of this ratio may be desirable in an application which utilizes a resistor other than a high value load resistor for a memory cell.

Various modifications and applications may therefore be made by those skilled in the art without departing from the scope of the invention as defined in the following claims.

What is claimed is:

1. A layered semiconductor resistor comprising:
   a first layer of substantially intrinsic semiconductor material having an upper surface and a polycrystalline structure that has grain boundaries, and
   a second layer of substantially intrinsic semiconductor material having an upper surface and said polycrystalline structure,
   wherein said second layer is formed over the upper surface of said first layer, and an interruption in said polycrystalline structure exists between said first and second layers.

2. The layered resistor of claim 1, wherein said interruption comprises an offset of the grain boundaries of said polycrystalline structure between said first and second layers.

3. The layered resistor of claim 1, wherein said interruption comprises a layer of dielectric material between said first and second layers.

4. The layered resistor of claim 3, wherein said layer of dielectric material is a silicon dioxide layer.

5. The layered resistor of claim 4, wherein said silicon dioxide layer has a thickness of less than 10Å.

6. The layered resistor of claim 1, wherein said semiconductor material is silicon.

7. The layered resistor of claim 1, wherein the resistance of said layered resistor is less susceptible to modulation than a single-layer resistor having the same dimensions as said layered resistor, said single-layer resistor consisting of a single layer of said substantially intrinsic semiconductor material having said polycrystalline structure.

8. The layered resistor of claim 1, wherein said layered resistor constitutes a load resistor in a low power static random-access memory cell.

9. A method for creating a layered modulation-resistant semiconductor resistor comprising the steps of:
   depositing a first layer of substantially intrinsic semiconductor material on an insulating layer, said first layer having an upper surface and a polycrystalline structure, said polycrystalline structure having grain boundaries;
   discontinuing the depositing step for a predetermined time period; and
   continuing the depositing step to deposit a second layer of substantially intrinsic semiconductor material, said second layer having an upper surface and said polycrystalline structure,
   wherein said second layer is formed over said upper surface of said first layer and said discontinuing and continuing steps cause an interruption in said polycrystalline structure between said first and second layers.

10. The method of claim 9, wherein a predetermined number of additional layers are formed by performing the following subsequent steps for each additional layer:
   discontinuing the depositing step for a predetermined time period; and
   continuing the depositing step to deposit an additional layer of substantially intrinsic semiconductor material, said additional layer having an upper surface and said polycrystalline structure,
   wherein said additional layer is formed over an upper surface of a previously deposited layer and said discontinuing and continuing steps cause an interruption in said polycrystalline structure between said previously deposited layer and said additional layer.

11. The method of claim 9, wherein said semiconductor material comprises silicon.

12. The method of claim 9, wherein said substantially intrinsic semiconductor material is deposited by low pressure chemical vapor deposition.

13. The method of claim 12, wherein said discontinuing step is performed by eliminating the flow of a reactant gas.

14. The method of claim 13, wherein said first layer is maintained in a vacuum during said discontinuing step and said interruption comprises an offset of the grain boundaries of said polycrystalline structure between said first and second layers.

15. The method of claim 13, wherein said first layer is removed from a vacuum during said discontinuing step and said interruption comprises a layer of insulating material between said first and second layers.

16. The method of claim 15, wherein said insulating material comprises silicon dioxide.

17. The method of claim 16, wherein said discontinuing step creates a layer of silicon dioxide having a thickness of less than 10Å.

18. The method of claim 9, wherein the resistance of the resulting layered resistor is less susceptible to modulation than a single-layer resistor having the same dimensions as said layered resistor, said single-layer resistor consisting of a single layer of said substantially intrinsic semiconductor material having said polycrystalline structure.

* * * * *